United States Patent
Nobuo et al.

(10) Patent No.: US 8,643,514 B1
(45) Date of Patent: Feb. 4, 2014

(54) METHOD FOR DECODING DATA

(75) Inventors: Fujhara Nobuo, Tokyo (JP); Kenichi Tashiro, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/596,724

(22) Filed: Aug. 28, 2012

(51) Int. Cl.
*H03M 5/08* (2006.01)

(52) U.S. Cl.
USPC ................. 341/53; 341/50; 341/155

(58) Field of Classification Search
USPC .......... 341/155, 157, 166, 53, 50, 51; 375/238
See application file for complete search history.

(56) References Cited

U.S. PATENT DOCUMENTS

| | | | | |
|---|---|---|---|---|
| 5,631,596 A | * | 5/1997 | Sporck et al. | 327/378 |
| 5,914,622 A | * | 6/1999 | Inoue | 327/172 |
| 6,072,338 A | * | 6/2000 | Nishiuchi | 327/31 |

* cited by examiner

*Primary Examiner* — Peguy Jean Pierre
(74) *Attorney, Agent, or Firm* — John R. Pessetto; Wade J. Brady, III; Frederick J. Telecky, Jr.

(57) ABSTRACT

Methods for decoding data are disclosed herein. The data is coded such that a transition from a first state to a second state represents a logic one and a transition from the second state to the first state represents a logic zero. An embodiment includes determining a pulse width for a first pulse and measuring the width of a second pulse, wherein the second pulse occurs directly after the first pulse. The method continues with comparing the second pulse width to at least one first predetermined period and assigning a value to the second pulse width when the second pulse width is within at least one of the first predetermined periods. The method also includes assigning a value to the second pulse width based on the value assigned to the first pulse width when the second pulse width is not within at least one of the first predetermined periods.

17 Claims, 4 Drawing Sheets

METHOD FOR DECODING DATA

BACKGROUND

Some data encoding uses high/low transitions to represent logic states. For example, a transition from a low state to a high state may represent a logic one and a transition from a high state to a low state represents a logic zero. The resulting waveform has a plurality of high and low pulses that occur between the logic transitions. In such coding schemes, the period in which the waveform is high or low is important to establish the correct timing when the waveform is decoded. For example a logic one followed by a logic zero will require a pulse that is twice as long as a pulse representing logic one followed by a logic one. If the shorter pulse is too long, it may be decoded as a logic one followed by a logic zero rather than a logic one followed by another logic one.

The coded data may be modulated for transmission to a receiver. For example, amplitude-shift key (ASK) modulation may be applied to the coded data in order to transmit the data. An inherent problem with data transmission is that the receiving antenna typically distorts the data so that the lengths of the high and low periods change slightly. These changes may cause errors when the data is demodulated. For example, the decoding process may not be able to determine if a single pulse represents a single transition or two transitions, such as a logic high followed by a logic low.

SUMMARY

Methods for decoding data are disclosed herein. The data is coded such that a transition from a first state to a second state represents a logic one and a transition from the second state to the first state represents a logic zero. An embodiment of the method includes determining a pulse width for a first pulse and measuring the width of a second pulse, wherein the second pulse occurs directly after the first pulse. The method continues with comparing the second pulse width to at least one first predetermined period and assigning a value to the second pulse width if the second pulse width is within at least one of the first predetermined periods. The method includes assigning a value to the second pulse width based on the value assigned to the first pulse width if the second pulse width is not within at least one of the first predetermined periods.

DETAILED DESCRIPTION

Figure 1:
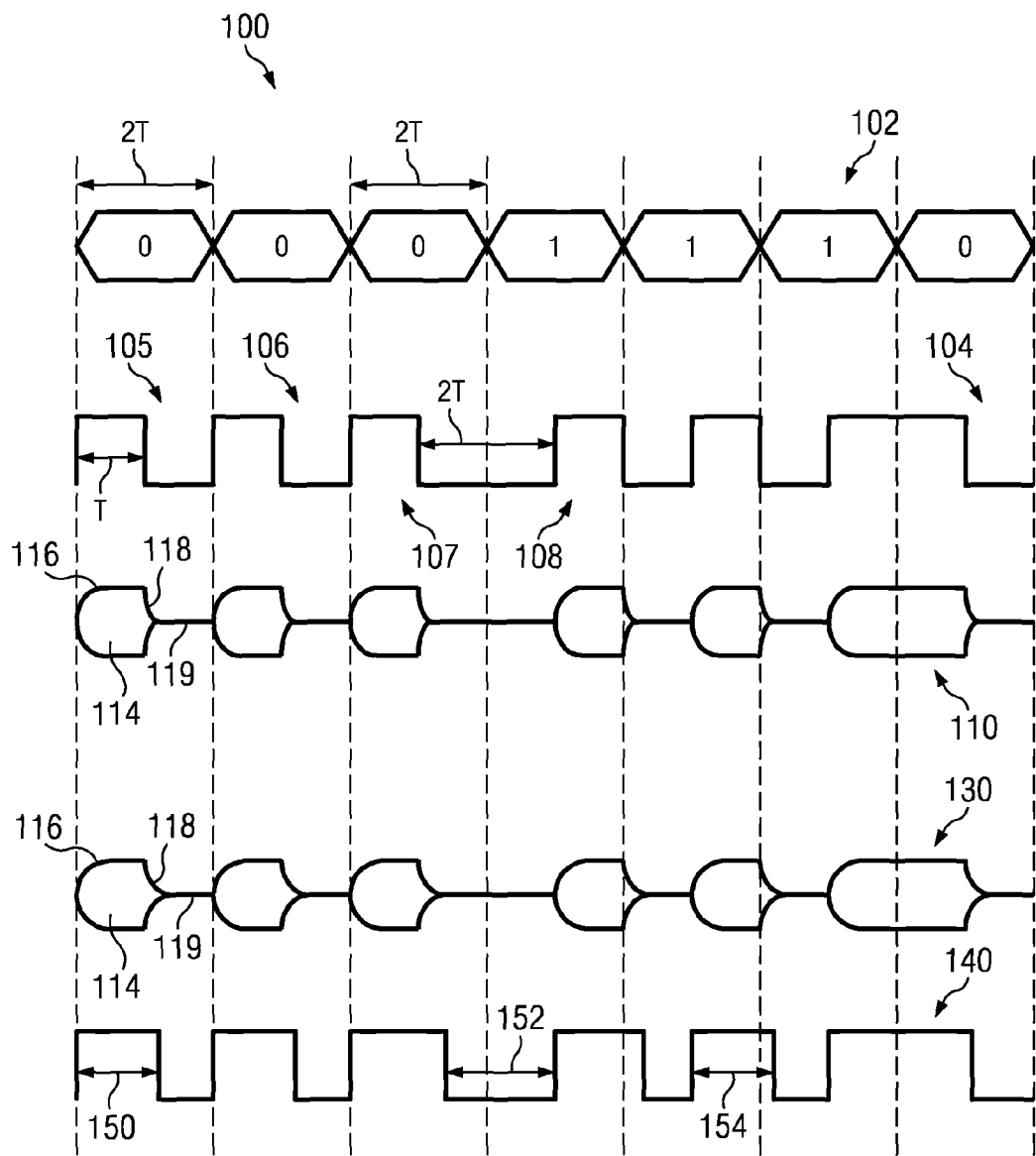
FIG. 1 is an example of data that has been coded, modulated, and demodulated.

Methods for decoding data are described herein. The data is binary data wherein logic zeros are coded as high to low transitions and logic ones are coded as low to high transitions. FIG. 1 is a timing diagram 100 of data that is coded, modulated, and demodulated. Raw data 102 is generated by a source (not shown) and is intended for eventual transmission to a receiver. The raw data 102 is in binary format and consists of a plurality of bits wherein each of the bits represent a logic one or a logic zero. The time in which each bit is represented in FIG. 1 is a period defined as 2 T.

The raw data 102 is coded using the Manchester coding format, which yields the coded data 104. The Manchester coding is well-known in the art and consists of a high to low transition for a logic zero and a low to high transition for a logic one. Therefore, during each period of 2 T (the period of one bit), each bit will be coded to either a zero to one or one to zero transition. The start of a bit to the transition in the coded data 104 is shown in FIG. 1 as having a period of T, which is half the period of a bit. As shown in the coded data 104, two consecutive and equal bits results in two pulses that each have the period T. For example, raw data of a logic zero bit followed by a logic zero bit is coded to a high to low transition for the first logic zero as shown by a first coded bit 105. The second logic zero bit is also coded to a second low to high transition as shown by a second coded bit 106. In order to achieve the coded bits 105, 106, the first coded bit 105 needs to have a high pulse followed by a low pulse. Each of these pulses is referred to has having a period T. Likewise, the second coded bit 106 needs to have a high pulse followed by a low pulse, wherein both pulses are referred to as having a period T.

The longest pulse in the coded data 104 occurs when the raw data 102 has two subsequent and opposite bits. For example, when the raw data has a zero bit followed by a one bit or a one bit followed by a zero bit, the corresponding coded data 104 will have pulses that have periods of 2 T. Reference is made to a third coded bit 107 and a fourth coded 108 in the coded data 104. The raw data representing the third coded bit 107 is a zero bit and the raw data representing the fourth coded bit 108 is a one bit. Therefore, the third coded bit 107 is a high to low transition and the fourth coded bit 108 is a low to high transition. The third coded bit 107 and the fourth coded bit 108 join with a low pulse having a period of 2 T. It is noted that a high bit in the raw data 102 followed by a low bit will yield coded bits with a high pulse having a period of 2 T. The longest pulse achievable using Manchester coding has a period of 2 T.

The coded data 104 is modulated for transmission. In the embodiment of FIG. 1, the coded data 104 is modulated using amplitude-shift key (ASK) modulation wherein a logic high from the coded data 104 is represented by a burst and a logic zero is represented by the lack of a burst. The burst may be similar to modulation used in amplitude modulation. The resulting modulated signal 110 is shown in FIG. 1. It is noted that the above-described bursts are shown as envelopes in the modulated data 110.

An exemplary burst 114, which is representative of all the bursts in the modulated signal 110, will be described. The burst 114 has a leading edge 116 and a trailing edge 118. In ideal conditions, the rise time of the leading edge 116 and the fall time of the trailing edge 118 are virtually instantaneous. Although, there will be some delay due to the characteristics of the modulation. As shown in FIG. 1, the burst 114 is an ideal situation wherein the leading edge 116 and the falling edge 118 are very quick. The time between the bursts 114 is referred to as the logic low time 119 or simply the low time 119. When the ideal modulated signal 110 is transmitted and received under ideal conditions, the received signal will be the same as the modulated signal 110. Therefore, when the received signal is demodulated, it will be the same as the coded data 104, which is very easily decoded to the raw data 102.

Under real conditions, the modulated signal 110 is typically distorted during transmission. For example, when the modulated signal 110 is transmitted and/or received by way of a high Q antenna, the leading edges 116 and the falling edges 118 of the bursts 114 will not be as quick as when the modulated signal 110 was generated. This distortion causes the bursts 114 to extend into the low time 119 where no burst should be present. An example of received signal after being received by a high Q antenna is shown by the received signal 130. As shown by the received signal 130, the leading edges 116 and the trailing edges 118 are extended, which causes them to interfere with the low time 119.

When the distorted, received signal 130 is demodulated, it yields a distorted demodulated signal. An example of a distorted demodulated signal is shown by the demodulated signal 140. Ideally, the demodulated signal 140 should be the same as the coded signal 104. However, the antennas in the transmitter and/or the receiver caused distortions to the demodulated signal 140. Reference is made to three pulses in the demodulated signal 140, a first pulse 150, a second pulse 152, and a third pulse 154 which will be used to describe the methods for decoding the demodulated signal 140. Due to the distortions, conventional decoders may not be able to accurately determine the widths of these pulses. Accordingly, the conventional decoders may decide that pulses that should have periods of 1 T have periods of 2 T and visa versa. These decoding errors will cause the data decoded from the demodulated signal 140 to be erroneous.

Methods are described herein that overcome the erroneous decoding associated with conventional decoders. In summary, the methods described herein measure the pulse widths. If the pulse widths are not within specified time periods, the methods incorporate the previous pulse width into the present pulse width. Based on this incorporation, the width of the present pulse is determined.

Figure 2:
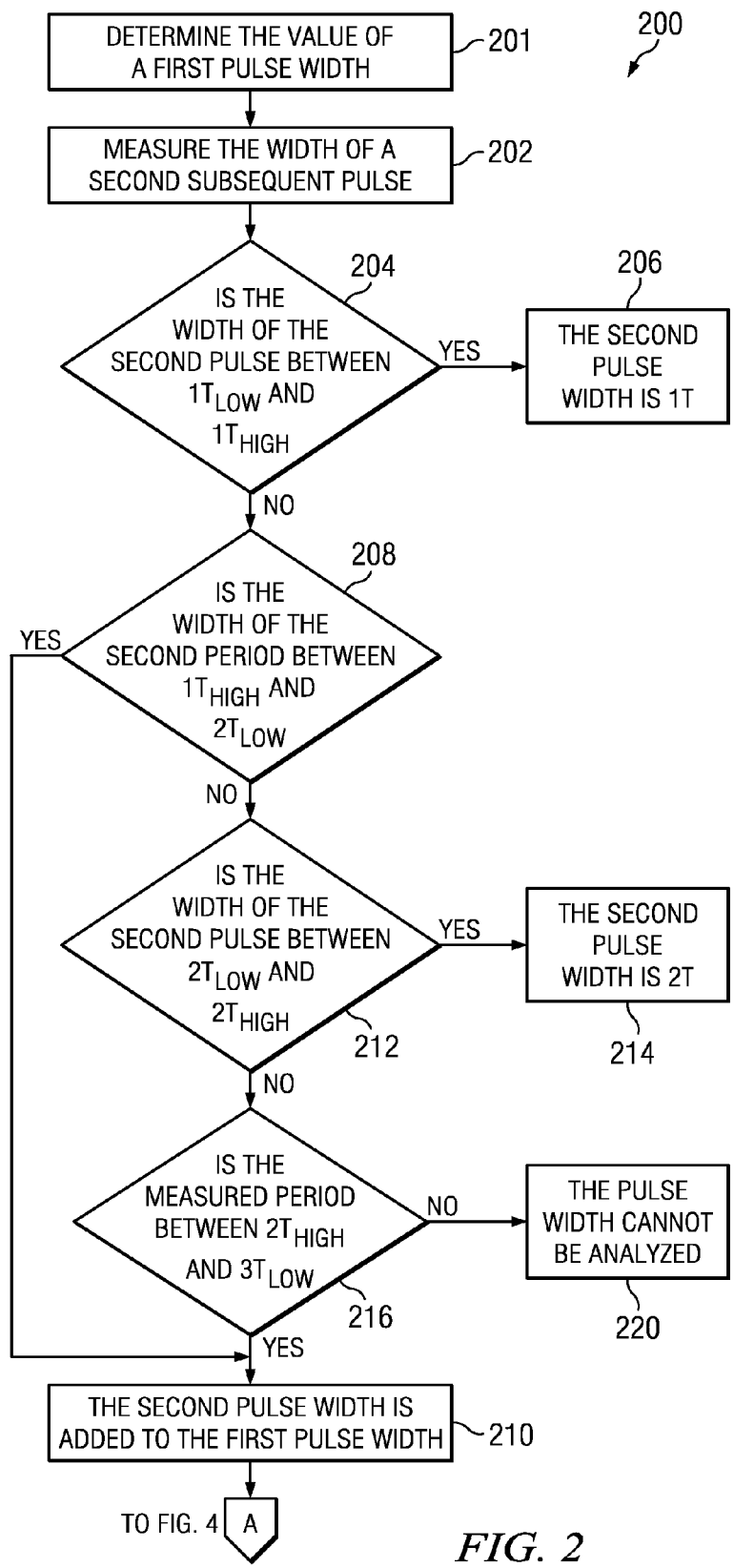
FIG. 2 is a flow chart describing an embodiment for determining the pulse width of a demodulated signal.
Figure 3:
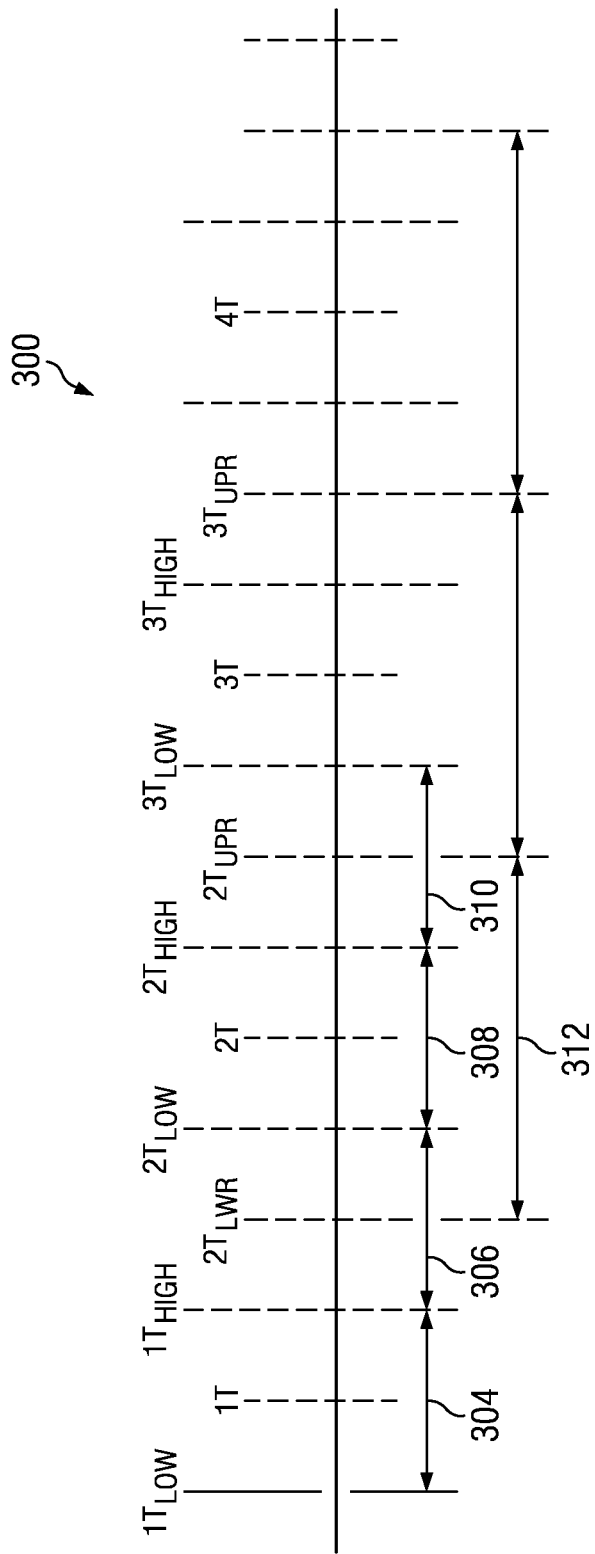
FIG. 3 is a timing diagram referenced by the flow chart of FIG. 2.

An embodiment of the method is described in the flowchart 200 of FIG. 2 with additional reference to the timing diagram 300 of FIG. 3. The method commences at step 201 with determining a value of a first pulse width. The first pulse occurred directly before the pulse width being measured by the methods described herein. The value of the first pulse width will either be 1 T or 2 T and may have been determined by using the foregoing method. The method proceeds to step 202 by measuring the width of a second pulse. The second pulse is the one being analyzed by the methods described herein. The pulse width is the time or distance between two edges of the pulse as is well-known in the art. With reference to FIG. 1, the edges may be the distance between any rising or falling edge of the demodulated signal 140 and its next rising or falling edge. As described above, the demodulated signal 140 may be distorted due to the antenna and other issues in the demodulation. The distortion may cause the width of the second pulse to be some value other than 1 T or 2 T.

A decision block 204 determines if the measured width of the second pulse is between times 1 $T_{LOW}$ and 1 $T_{HIGH}$. 1 $T_{LOW}$ and 1 $T_{HIGH}$ are predetermined periods that constitute the boundaries for a pulse having a width of 1 T. For example, 1 $T_{LOW}$ is the lowest threshold pulse width and 1 $T_{HIGH}$ is the highest threshold pulse width. The time for a pulse width between 1 $T_{LOW}$ and 1 $T_{HIGH}$ is shown as the period 304 in the time line 300 of FIG. 3. If the result of the decision block 204 is positive, then a determination is made at step 206 that the second pulse has a width of 1 T. The analysis on the second pulse ends and another pulse is analyzed. It is noted that the process may proceed to step 201 where the first pulse has a value of 1 T as determined by step 206.

If the result of the decision block 204 is negative, processing proceeds to decision block 208 where a determination is made as to whether the width of the second pulse is between 1 $T_{HIGH}$ and 2 $T_{LOW}$. The value of 2 $T_{LOW}$ is the lowest threshold for a pulse having a width of 2 T. The period between 1 $T_{HIGH}$ and 2 $T_{LOW}$ is shown as the period 306 on the timing diagram 300. The period 306 does not correspond to either a period of 1 T or 2 T. If the result of the decision block 208 is positive, then the processing proceeds to step 210 where the width of the first pulse is added to the width of the second pulse; the result is referred to as the enhanced pulse or enhanced pulse width. Processing then proceeds to the flow chart 400, which is described in greater detail below.

If the result of decision block 208 is negative, then processing proceeds to decision block 212, where a determination is made as to whether the width of the second pulse is between 2 $T_{LOW}$ and 2 $T_{HIGH}$. 2 $T_{LOW}$ and 2 $T_{HIGH}$ are predetermined thresholds for the length of a pulse having a period of 2 T. The period between 2 $T_{LOW}$ and 2 $T_{HIGH}$ is shown as period 308 on the timing diagram 300. If the result of the decision block 212 is positive, then processing proceeds to step 214 where the period of the second pulse is deemed to be 2 T. Processing for the present pulse is complete and the next pulse may be analyzed. In this situation, the next pulse is analyzed at block 201 using a first pulse width of 2 T If the result of decision block 212 is negative, then processing proceeds to decision block 216 where a determination is made as to whether the width of the second pulse is between 2 $T_{HIGH}$ and 3 $T_{LOW}$ as shown by the distance 310 on the timing diagram 300. 3 $T_{LOW}$ is the lower threshold of a pulse having a length of 3 T. It is noted that such a pulse cannot exist with Manchester coding, but for analysis purposes and because of distortion during transmission, the second pulse width is measured up to a length of 3 $T_{LOW}$. If the result of decision block 216 is positive, processing proceeds to step 210, which was described above. If the result of decision block 216 is negative, processing proceeds to step 220. Step 220 determines that the width of the second pulse does not fit any criteria and cannot be analyzed. Processing may cease or other measures, such as remeasuring the pulse width may be performed.

Figure 4:
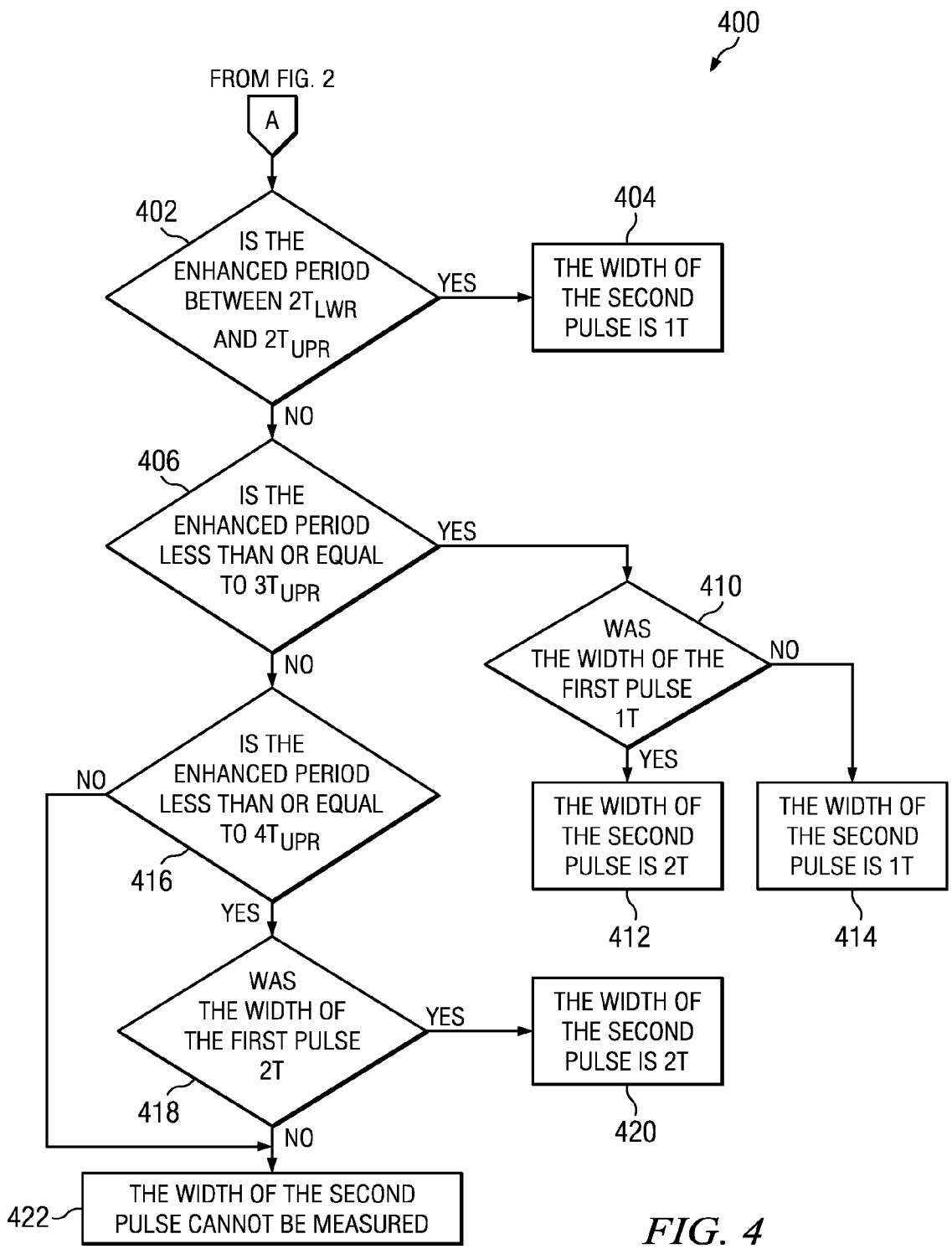
FIG. 4 is a continuation of the flow chart of FIG. 2.

At this point in the processing, the width of the second pulse either fit within the length of 1 T or 2 T, was too long to be analyzed, or will be analyzed per the flow chart 400, FIG. 4. Flow chart 400 applies to a second pulse width having a period outside of the thresholds of 1 T or 2 T and that is not too long to be analyzed. In this situation, processing proceeded to step 210. As stated above, step 210 adds the time of the first pulse to the second pulse. The resulting pulse is referred to as having enhanced time or being the enhanced pulse width. Processing then proceeds to the flow chart 400 of FIG. 4.

The flow chart 400 commences with decision block 402 that determines if the enhanced pulse width is between 2 $T_{LWR}$ and 2 $T_{UPR}$ which is marked on the timing diagram as the period 312. The value 2 $T_{LWR}$ is a time that is between the value of 1 T and 2 T. For example, the value 2 $T_{LWR}$ may be the time that is approximately directly between the times of 1 T and 2 T. Likewise the value of 2 $T_{UPR}$ is between 2 T and 3 T and may be located approximately directly between 2 T and 3 T. If decision block 402 is positive, then the width of the first pulse was 1 T and the enhanced pulse width is within the limitations (2 $T_{LWR}$ and 2 $T_{UPR}$) of 2 T. In this situation, processing proceeds to step 404 where the width of the second pulse is deemed to be 1 T. Processing of the decoded data 140, FIG. 1, proceeds to step 201 wherein the first pulse width is determined to have a value of 1 T based on the foregoing analysis.

If the result of the decision block 402 is negative, processing proceeds to decision block 406, where a determination is made as to whether the enhanced period is less than a value of 3 $T_{UPR}$. The value 3 $T_{UPR}$ is the absolute upper threshold of a pulse width having a period of 3 T. If the enhanced period is less than 3 $T_{UPR}$, then processing proceeds to decision block 410, which determines if the width of the first pulse was 1 T. If the first pulse had a width of 1 T, then the second pulse is deemed to have a width of 2 T as shown in step 412. More specifically, the value of 1 T of the first pulse added to the value of 2 T from the second pulse, which yields the enhanced period of 3 T. Referencing decision block 410 again, if the width of the first pulse was not 1 T, then it had to be 2 T, so processing proceeds to step 414 where the width of the second pulse is deemed to be 1 T. More specifically, the 2 T width of the first pulse is added to a second pulse width of 1 T to yield the enhanced pulse width of 3 T.

Referring again to the decision block 406, if the result is negative, then processing proceeds to decision block 416 where a determination is made as to whether the enhanced pulse width is less than a value of 4 $T_{UPR}$. The value 4 $T_{UPR}$ is the maximum width that a pulse having a length of 4 T may have. It is noted that such a situation has to be a high pulse having a width of 2 T followed by a low pulse having a width of 2 T or vice versa. The first pulse width is added to the second pulse width to get an enhanced pulse width of 4 T. In order to assure that the first pulse width was 2 T, processing proceeds to decision block 418 to verify that the first pulse width was 2 T. If the result of decision block 418 is positive, processing proceeds to step 420 where the width of the second pulse is determined to be 2 T.

If either the decision block 416 or the decision block 418 yield negative results, processing proceeds to block 422 were a determination is made that the second pulse width cannot be analyzed. More specifically, a negative result from decision block 416 means that the enhanced pulse width was longer than 4 T or threshold associated with 4 T, which cannot occur with Manchester coding. More specifically, either the first pulse or the second pulse width would have to be longer than 2 $T_{UPR}$, which cannot occur with Manchester coding. If the result of decision block 418 is negative, then the first pulse width has to be 1 T, which means that the second pulse width has to be 3 T, which cannot occur with Manchester coding.

The methods described above may be implemented on a computer wherein instructions for the implementation are in the form of computer-readable instructions. The computer-readable instructions may be in the form of software, firmware, or hardware. In such embodiments, the demodulated signal 140, FIG. 1, is analyzed to detect the transitions and to measure the times between the transitions. These times are the pulse widths that are analyzed as described above.

By using the above-described methods for decoding data, the data is able to be decoded faster than conventional techniques and with fewer errors. As described above, if a pulse width cannot be readily determined, it's width is analyzed in light of the width of the previous pulse. Therefore, more information than simply the width of pulse being measured is used to determine the width.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for decoding data, wherein the data is coded such that a transition from a first state to a second state represents a logic one and a transition from the second state to the first state represents a logic zero, the method comprising:
   determining a pulse width for a first pulse;
   measuring the width of a second pulse, wherein the second pulse occurs directly after the first pulse;
   comparing the second pulse width to at least one first predetermined period;
   assigning a value to the second pulse width when the second pulse width is within at least one of the first predetermined periods; and
   assigning a value to the second pulse width based on the value assigned to the first pulse width when the second pulse width is not within at least one of the first predetermined periods;
   coding raw data, the raw data comprising bits having either logic high states or logic low states; and wherein the first predetermined period is half the period of a bit.

2. The method of claim 1, wherein the second predetermined period is the period of a bit.

3. The method of claim 2, wherein assigning a value to the second pulse width based on the value assigned to the first pulse width comprises adding the time of the first pulse width to the second pulse width to yield an enhanced pulse width when the second pulse width is between an upper limit of the first predetermined period and a lower limit of the second predetermined period.

4. The method of claim 3 and further comprising determining that the second pulse width has a period of one half the period of a bit when the enhanced pulse width is within a third predetermined period, the third predetermined period having a lower threshold that is lower than the lower limit of the second predetermined period and an upper threshold that is greater than the upper limit of the second predetermined period.

5. The method of claim 4, wherein the third predetermined period is substantially centered around a period of one bit.

6. The method of claim 4, and further comprising:
   determining when the enhanced period is less than or equal to the period of one and one half bits;
   when the enhanced period is less than or equal the period of one and one half bits, then determining when the first pulse width was determined to have a value of one half bit;
   assigning a period of one bit to the second pulse width when the first pulse width was determined to have a value of one half bit; and
   assigning a period of one half bit to the second pulse width when the first pulse width was determined to have a value of one bit.

7. The method of claim 6 and further comprising:
   determining when the enhanced period is less than or equal to the period of two bits;
   when the enhanced period is less than or equal to the period of two bits then determining whether the first pulse width was assigned a value of the period of one bit; and
   assigning a pulse width of the period of one bit to the second pulse width when the first pulse width was determined to have a value of the period of one bit.

8. The method of claim 7 and further determining that the second pulse width cannot be determined when the first pulse width was not determined to be the period of one bit.

9. The method of claim 2, wherein assigning a value to the second pulse width based on the value assigned to the first pulse width comprises adding the time of the first pulse width to the second pulse width to yield an enhanced pulse width when the second pulse width is between the upper limit of the period of one bit and the lower limit of the period of one and one half bits.

10. The method of claim 9 and further comprising determining that the second pulse width has a period of one half the period of a bit when the enhanced pulse width is within a third predetermined period, the third predetermined period having a lower threshold lower that is lower than a lower limit of the second predetermined period and an upper threshold that is greater than the upper limit of the second predetermined period.

11. The method of claim 10, wherein the third predetermined period is substantially centered around a period of one bit.

12. The method of claim 10, and further comprising:
determining when the enhanced period is less than or equal to the period of one and one half bits;
when the enhanced period is less than or equal the period of one and one half bits, then determining when the first pulse width was determined to have a value of one half bit;
assigning a period of one bit to the second pulse width when the first pulse width was determined to have a value of one half bit; and
assigning a period of one half bit to the second pulse width when the first pulse width was determined to have a value of one bit.

13. The method of claim 12 and further comprising:
determining when the enhanced period is less than or equal to the period of two bits;
when the enhanced period is less than or equal to the period of two bit then determining whether the first pulse width was assigned a value of the period of one bit; and
assigning a pulse width of one bit to the second pulse width when the first pulse width was determined to have a value of the period of one bit.

14. The method of claim 13 and further determining that the second pulse width cannot be determined when the first pulse width was not determined to be the period of one bit.

15. A computer comprising:
computer-readable medium having instructions for decoding data, wherein the data is coded such that a transition from a first state to a second state represents a logic one and a transition from the second state to the first state represents a logic zero, the instructions comprising:
determining a pulse width for a first pulse;
measuring the width of a second pulse, wherein the second pulse occurs directly after the first pulse;
comparing the second pulse width to at least one first predetermined period;
assigning a value to the second pulse width when the second pulse width is within at least one of the first predetermined periods; and
assigning a value to the second pulse width based on the value assigned to the first pulse width when the second pulse width is not within at least one of the first predetermined periods;
wherein raw data is coded, the raw data comprising bits having either logic high states or logic low states; and wherein the first predetermined period is half the period of a bit and the second predetermined period is the period of a bit.

16. The computer of claim 15, wherein assigning a value to the second pulse width based on the value assigned to the first pulse width comprises adding the time of the first pulse width to the second pulse width to yield an enhanced pulse width when the second pulse width is between an upper limit of the first predetermined period and a lower limit of the second predetermined period.

17. A method for decoding data, wherein the data is coded such that a transition from a first state to a second state represents a logic one and a transition from the second state to the first state represents a logic zero, the method comprising:
coding raw data, the raw data comprising bits having either logic high states or logic low states, wherein a first predetermined period is half the period of a bit and a second predetermined period is the period of one bit;
determining a pulse width for a first pulse;
measuring the width of a second pulse, wherein the second pulse occurs directly after the first pulse;
comparing the second pulse width to the first predetermined period;
assigning a first value to the second pulse width when the second pulse width is within the first predetermined period;
assigning a second value to the second pulse width when the second pulse width is within the second predetermined period; and
assigning a value to the second pulse width based on the value assigned to the first pulse width when the second pulse width is not within either the first predetermined period or the second predetermined period;
wherein assigning a value to the second pulse width based on the value assigned to the first pulse width comprises adding the time of the first pulse width to the second pulse width to yield an enhanced pulse width when the second pulse width is between an upper limit of the first predetermined period and a lower limit of the second predetermined period.

* * * * *